(12) United States Patent
Nishio et al.

(10) Patent No.: US 11,973,116 B2
(45) Date of Patent: Apr. 30, 2024

(54) SEMICONDUCTOR DEVICE (71) Applicant: KABUSHIKI KAISHA TOSHIBA, Tokyo (JP)

(72) Inventors: Johji Nishio, Machida (JP); Chiharu Ota, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 138 days.

(21) Appl. No.: 17/643,558

(22) Filed: Dec. 9, 2021

(65) Prior Publication Data

US 2022/0359665 A1 Nov. 10, 2022

(30) Foreign Application Priority Data

May 10, 2021 (JP) .................................. 2021-079530
Jun. 1, 2021 (JP) .................................. 2021-092078

(51) Int. Cl.
*H01L 29/16* (2006.01)
*H01L 29/04* (2006.01)
(Continued)

(52) U.S. Cl.
CPC ........ *H01L 29/1608* (2013.01); *H01L 29/045* (2013.01); *H01L 29/167* (2013.01); *H01L 29/7802* (2013.01); *H01L 29/861* (2013.01)

(58) Field of Classification Search
CPC ............... H01L 29/1608; H01L 29/045; H01L 29/7802; H01L 29/861; H01L 29/0603;
(Continued)

(56) References Cited

U.S. PATENT DOCUMENTS 7,825,487 B2 11/2010 Veliadis et al.
9,184,229 B2 11/2015 Ota et al.
(Continued)

FOREIGN PATENT DOCUMENTS

JP 2013-534732 A 9/2013
JP 2014-146748 A 8/2014
(Continued)

OTHER PUBLICATIONS

Konishi et al., "Inducing Defects in 3.3kV SiC MOSFETs by Annealing After ion Implantation and Evaluating Their Effect on Bipolar Degradation of the MOSFETs", Semicond. Sci. Technol. 33, Nov. 5, 2018, 15 Pages.

*Primary Examiner* — Shahed Ahmed
(74) *Attorney, Agent, or Firm* — Oblon, McClelland, Maier & Neustadt, L.L.P.

(57) ABSTRACT

According to one embodiment, a semiconductor device includes a silicon carbide member. The silicon carbide member includes an operating region including at least one of a diode or a transistor, and a first element region including at least one element selected from the group consisting of Ar, V, Al and B. The first element region includes a first region and a second region. A first direction from the first region toward the second region is along a [1-100] direction of the silicon carbide member. The operating region is between the first region and the second region in the first direction. The first element region does not include a region overlapping the operating region in a second direction along a [11-20] direction of the silicon carbide member. Or the first element region includes a third region overlapping the operating region in the second direction.

20 Claims, 5 Drawing Sheets (51) Int. Cl.
*H01L 29/167* (2006.01)
*H01L 29/78* (2006.01)
*H01L 29/861* (2006.01)

(58) Field of Classification Search
CPC ............. H01L 29/0615; H01L 29/7395; H01L 29/8611; H01L 29/161–167; H01L 21/0445–0495; H01L 29/66053–66068; H01L 29/66613–66628
See application file for complete search history.

(56) References Cited

U.S. PATENT DOCUMENTS

| | | |
|---|---|---|
| 10,236,370 B2 | 3/2019 | Mori et al. |
| 10,367,090 B2 | 7/2019 | Konishi et al. |
| 2014/0209927 A1 | 7/2014 | Nishio et al. |
| 2020/0251560 A1 | 8/2020 | Nishio et al. |
| 2021/0167167 A1* | 6/2021 | Kawada .............. H01L 29/1095 |
| 2021/0391437 A1* | 12/2021 | Ohse .................... H01L 21/0485 |
| 2022/0190114 A1* | 6/2022 | Tawara ............... H01L 29/7811 |

FOREIGN PATENT DOCUMENTS

| | | |
|---|---|---|
| JP | WO 2017/046868 A1 | 3/2017 |
| JP | 2017-174969 A | 9/2017 |
| JP | 6244826 B2 | 12/2017 |
| JP | 2019-75411 A | 5/2019 |
| JP | 2020-126919 A | 8/2020 |
| JP | 2021-15880 A | 2/2021 |

* cited by examiner

SEMICONDUCTOR DEVICE

CROSS-REFERENCE TO RELATED APPLICATIONS

This application is based upon and claims the benefit of priority from Japanese Patent Application No. 2021-079530, filed on May 10, 2021, and Japanese Patent Application No. 2021-092078, filed on Jun. 1, 2021; the entire contents of which are incorporated herein by reference.

FIELD

Embodiments described herein relate generally to a semiconductor device.

BACKGROUND

A semiconductor device includes, for example, silicon carbide. Stable characteristics are desired for the semiconductor device.

DETAILED DESCRIPTION

According to one embodiment, a semiconductor device includes a silicon carbide member. The silicon carbide member includes an operating region including at least one of a diode or a transistor, and a first element region including at least one element selected from the group consisting of Ar, V, Al and B. The first element region includes a first region and a second region. A first direction from the first region toward the second region is along a [1-100] direction of the silicon carbide member. The operating region is between the first region and the second region in the first direction. The first element region does not include a region overlapping the operating region in a second direction along a [11-20] direction of the silicon carbide member. Or the first element region includes a third region overlapping the operating region in the second direction. A first length of the first region along the first direction is longer than a third length of the third region along the second direction. A second length of the second region along the first direction is longer than the third length.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
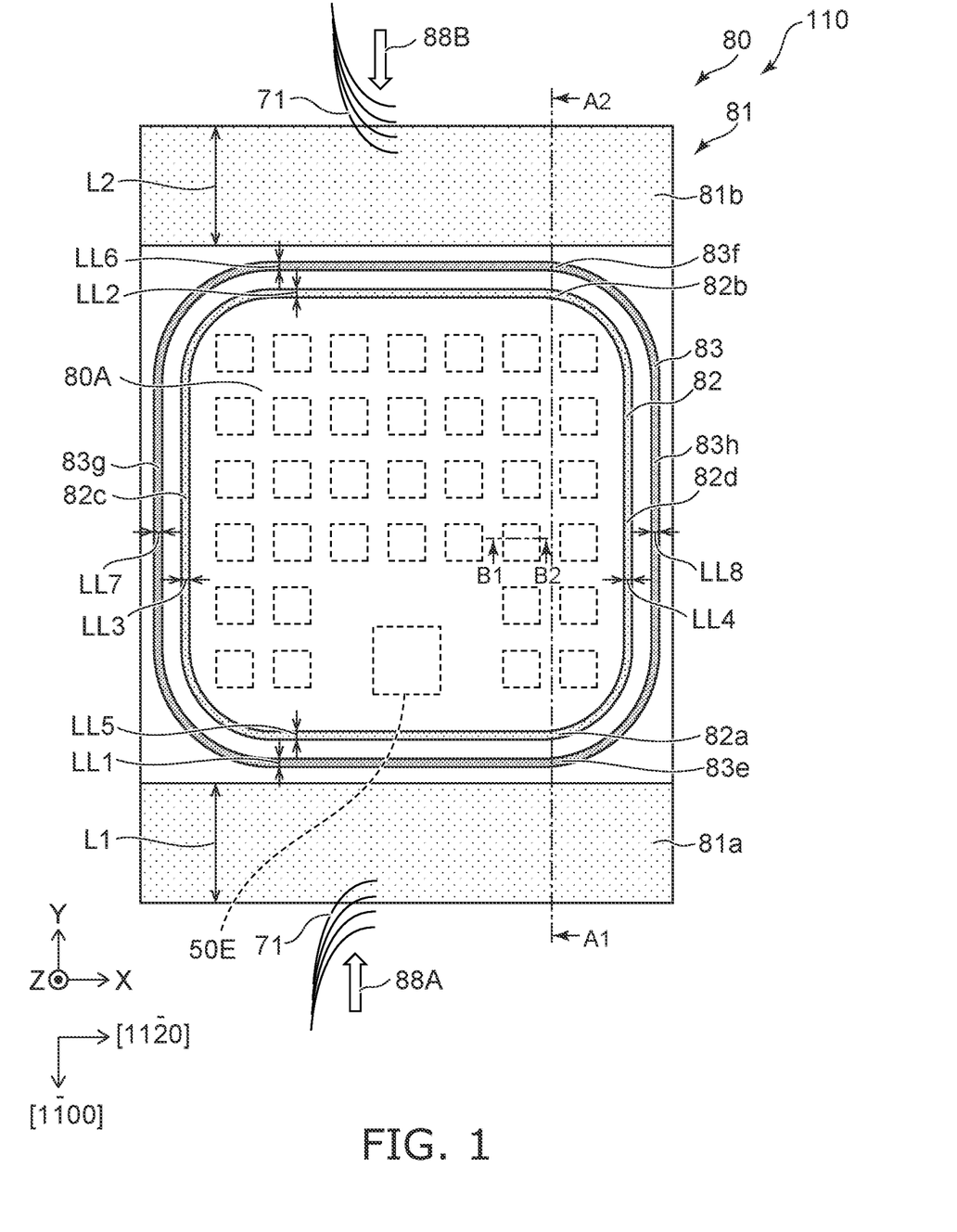
FIG. 1 is a schematic view illustrating a semiconductor device according to a first embodiment.
Figure 2:
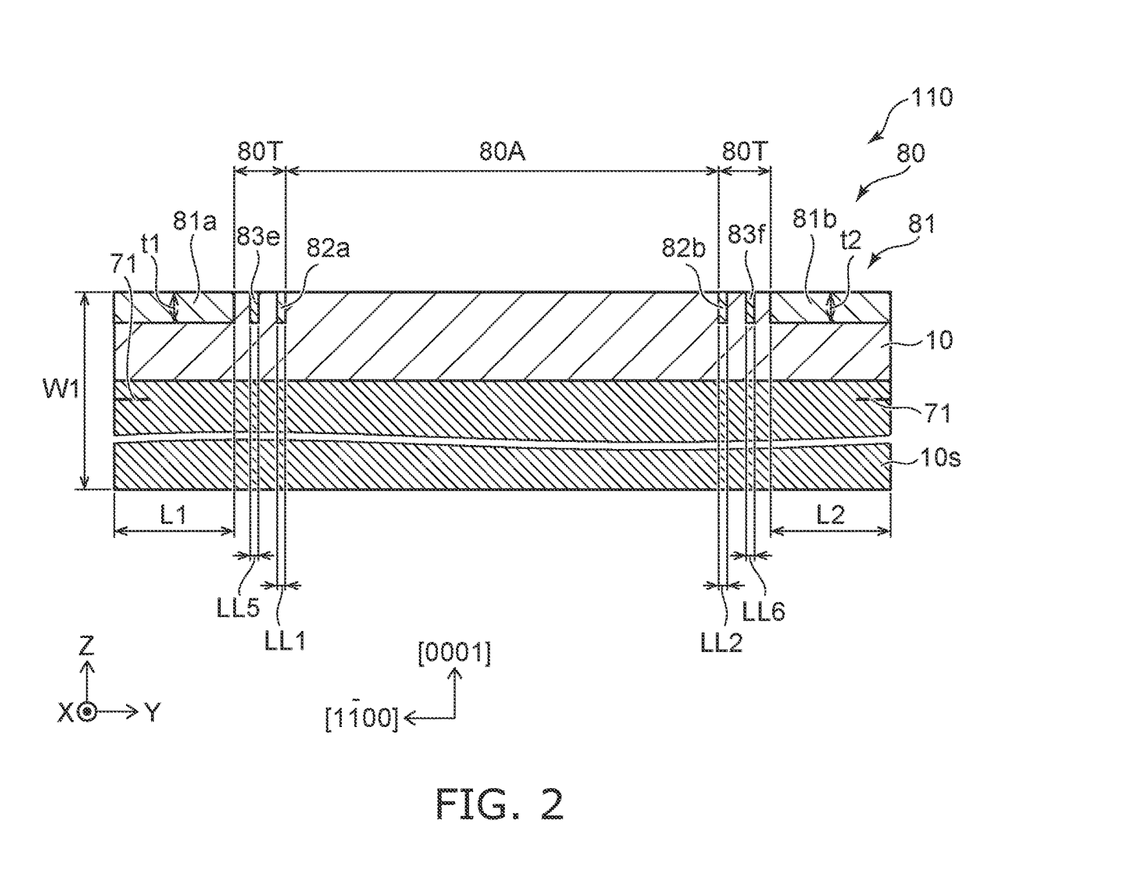
FIG. 2 is a schematic view illustrating the semiconductor device according to the first embodiment.

FIGS. 1 and 2 are schematic views illustrating a semiconductor device according to a first embodiment.

FIG. 1 is a plan view. FIG. 2 is a cross-sectional view taken along the line A1-A2 of FIG. 1.

As shown in FIGS. 1 and 2, a semiconductor device 110 according to the embodiment includes a silicon carbide member 80.

The silicon carbide member 80 includes silicon carbide (SiC). The silicon carbide member 80 includes an operating region 80A and a first element region 81. The operating region 80A includes at least one of a diode or a transistor. An example of the operating region 80A will be described later.

The first element region 81 includes a first element. The first element includes at least one selected from the group consisting of Ar, V, Al and B. The first element region 81 includes, for example, SiC and the first element.

The first element region 81 includes a first region 81a and a second region 81b. A first direction from the first region 81a toward the second region 81b is along the [1-100] direction of the silicon carbide member 80.

In this specification, in a notation such as "[1-100]", "-" indicates that a "bar" is added to the number after "-".

The first direction ([1-100] direction) is taken as a Y-axis direction. One direction perpendicular to the Y-axis direction is taken as an X-axis direction. A direction perpendicular to the Y-axis direction and the X-axis direction is taken as a Z-axis direction.

The X-axis direction may be inclined with respect to the [11-20] direction (see FIG. 4 and the like described later). An angle between the X-axis direction and the [11-20] direction may be, for example, not less than 0 degrees and not more than 10 degrees. As described above, the X-axis direction may be along the [11-20] direction while being inclined at a small angle with respect to the [11-20] direction.

The operating region 80A is located between the first region 81a and the second region 81b in the first direction (Y-axis direction).

The first element region 81 does not include, for example, a region that overlaps the operating region 80A in a second direction along the [11-20] direction of the silicon carbide member 80. The second direction corresponds to, for example, the X-axis direction.

Alternatively, as will be described later, the first element region 81 may include a region (such as a third region described later) that overlaps the operating region 80A in the second direction (X-axis direction). In this case, a width of the third region is smaller than a width of the first region 81a and the second region 81b. An example in which the first element region 81 includes the third region and the like will be described later.

In the semiconductor device 110 illustrated in FIGS. 1 and 2, the first element region 81 does not include a region that overlaps the operating region 80A in the second direction along the [11-20] direction. In the semiconductor device 110, the first region 81a and the second region 81b that overlap the operating region 80A in the first direction (Y-axis direction) along the [1-100] direction are provided. The first region 81a and the second region 81b do not contribute to the operation. In the embodiment, the first region 81a and the second region 81b have a function of stabilizing the characteristics of the semiconductor device 110.

As shown in FIG. 2, the silicon carbide member 80 includes a base body 10s and a first semiconductor region 10 provided on the base body 10s. The base body 10s is, for example, a SiC substrate. The first semiconductor region 10 is, for example, an n-type SiC layer. For example, a basal plane dislocation 71 (BPD) is present in the base body 10s. The basal plane dislocation 71 is along the {0001} plane of the base body 10s. Due to the basal plane dislocation 71, stacking faults occur during the operation of the semiconductor device 110. Due to the stacking fault, the operating voltage in the semiconductor device 110 changes. For example, the forward voltage Vf changes, causing Vf deterioration. For example, the breakdown voltage may decrease due to stacking faults. It is preferable to suppress the basal plane dislocation 71.

As a result of the examination by the inventors of the present application, it was found that the basal plane dislocation 71 glides (moves) in the silicon carbide member 80. For example, the basal plane dislocation 71 glides along the directions of arrows 88A and 88B shown in FIG. 1 (direction along the [1-100] direction). When the basal plane dislocation 71 reaches the operating region 80A, the stacking fault is formed during the operation, and the operation becomes unstable as described above.

The glide of the basal dislocation 71 is likely to occur, for example, in the operating region 80A or the like due to the introduction treatment of impurities into the silicon carbide member 80 (for example, ion implantation) and the subsequent heat treatment. The glide of the basal dislocation 71 may be related to, for example, the stress in the silicon carbide member 80 generated by these treatments.

As a result of the study by the inventors of the present application, it was found that the glide of the basal plane dislocation 71 can be suppressed by providing the above-mentioned first element region 81. As described above, the basal plane dislocation 71 glides along the first direction along the [1-100] direction. Therefore, the first element region 81 that suppresses the glide of the basal plane dislocation 71 is provided at a position in the first direction with reference to the operating region 80A. That is, the first region 81a and the second region 81b are provided so as to sandwich the operation region 80A in the first direction. As a result, the glide velocity of the basal plane dislocation 71 becomes substantially zero in the first region 81a and the second region 81b. The first region 81a and the second region 81b can suppress the reaching of the basal plane dislocation 71 to the operating region 80A. It is considered that one of the causes of the suppression of glide by the first region 81a and the second region 81b is, for example, that the stress is relaxed by these regions.

The first element region 81 (the first region 81a and the second region 81b) is a region that does not contribute to the operation of the semiconductor device 110. The area of the first element region 81 is preferably as small as practically possible. Thereby, for example, the operating current per unit area can be increased. For example, the cost can be suppressed. A more practical semiconductor device can be obtained.

In the semiconductor device 110, the first region 81a and the second region 81b are provided as the first element region 81 for suppressing glide. The first element region 81 does not include a region that overlaps the operating region 80A in the second direction along the [11-20] direction. As a result, it is possible to provide a practical semiconductor device having stable characteristics and a small area of the first element region 81.

Figure 3:
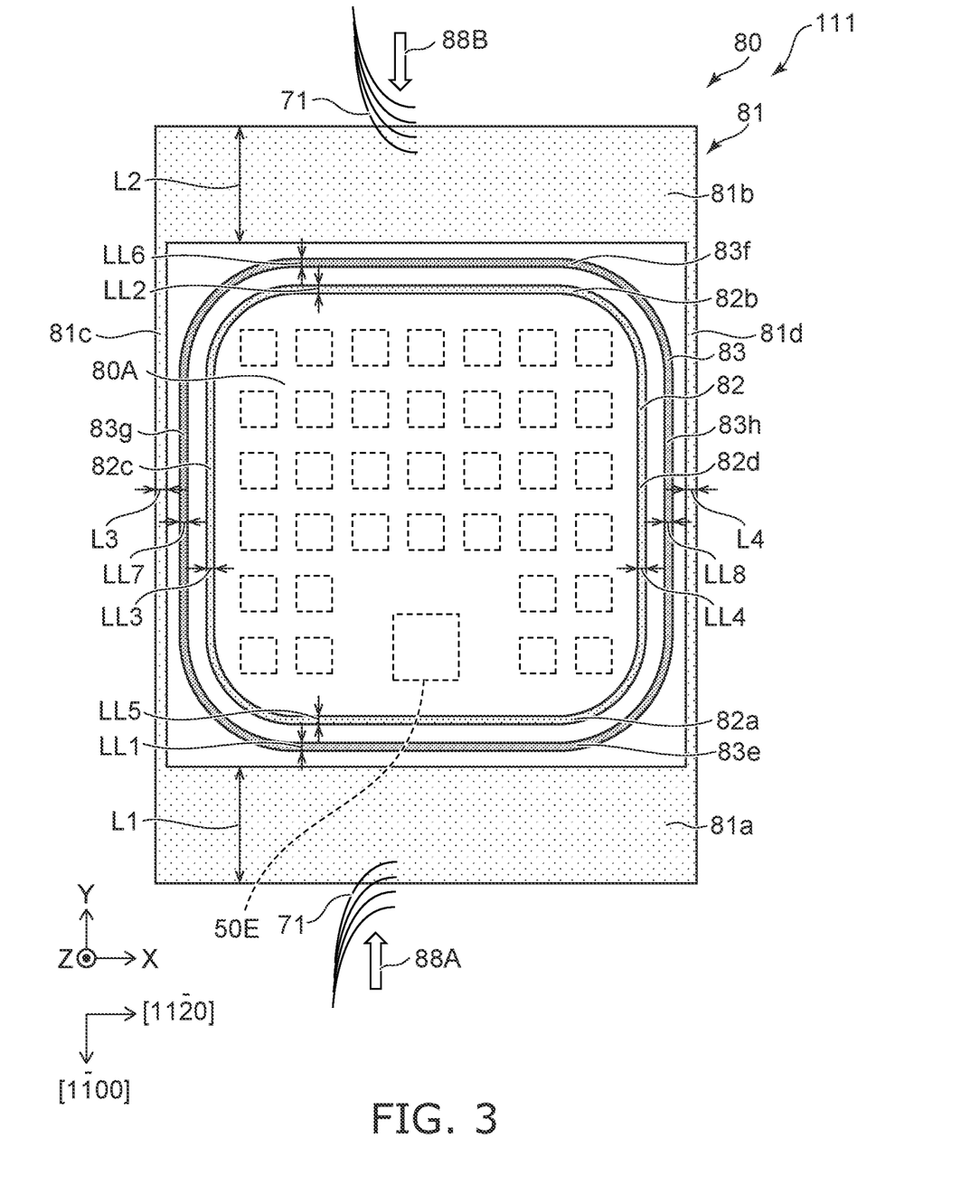
FIG. 3 is a schematic view illustrating a semiconductor device according to the first embodiment.

FIG. 3 is a schematic view illustrating a semiconductor device according to the first embodiment.

As shown in FIG. 3, a semiconductor device 111 according to the embodiment also includes the silicon carbide member 80. Also in this example, the silicon carbide member 80 includes the operating region 80A and the first element region 81. In the semiconductor device 111, the first element region 81 includes the first region 81a, the second region 81b, and a third region 81c. In this example, the first element region 81 includes a fourth region 81d. Other configurations of the semiconductor device 111 may be the same as those of the semiconductor device 110.

The first direction from the first region 81a toward the second region 81b is along the [1-100] direction of the silicon carbide member 80. Also in this case, the operating region 80A is between the first region 81a and the second region 81b in the first direction. The third region 81c overlaps the operating region 80A in the second direction along the [11-20] direction. For example, the operating region 80A is between the third region 81c and the fourth region 81d in the second direction.

An area of the third region 81c and the fourth region 81d is smaller than an area of the first region 81a and the second region 81b.

For example, as shown in FIGS. 1 and 3, a length of the first region 81a along the first direction is taken as a first length L1. A length of the second region 81b along the first direction is taken as a second length L2. As described above, the first direction is along the [1-100] direction.

For example, as shown in FIGS. 1 and 3, a length of the third region 81c along the second direction is taken as the third length L3. A length of the fourth region 81d along the second direction is taken as a fourth length L4. As described above, the second direction is along the [11-20] direction.

In the embodiment, the first length L1 is longer than the third length L3. The second length L2 is longer than the third length L3. The first length L1 is longer than the fourth length L4. The second length L2 is longer than the fourth length L4. Since the first length L1 and the second length L2 are long, the glide of the basal plane dislocation 71 can be effectively suppressed. Since the third length L3 and the fourth length L4 are short, the operating current per unit area can be increased. For example, the cost can be suppressed. A more practical semiconductor device can be obtained.

In the embodiment, the first length L1 is preferably, for example, not less than 10 times and not more than 40 times the third length L3. The second length L2 is preferably not less than 10 times and not more than 40 times the third length L3. The first length L1 is preferably, for example, not less than 10 times and not more than 40 times the fourth length L4. The second length L2 is preferably not less than 10 times and not more than 40 times the fourth length L4. As a result, the area of the semiconductor device can be effectively reduced while effectively suppressing the glide of the basal plane dislocation 71.

In the embodiment, each of the first length L1 and the second length L2 is preferably, for example, not less than 10 μm. As a result, it is possible to suppress the reaching of the glide basal plane dislocation 71 to the operating region 80A. Each of the first length L1 and the second length L2 may be not less than 20 μm. It is possible to more reliably suppress the reaching of the glide basal plane dislocation 71 to the operating region 80A. Each of the first length L1 and the second length L2 may be, for example, not more than 1000 µm. When each of the first length L1 and the second length L2 exceeds 1000 µm, for example, the effect of the suppressing the reaching of the glide basal plane dislocation 71 to the operating region 80A is saturated.

A concentration of the first element in the first region 81a is preferably, for example, not less than $1×10^{15}$ cm$^{-2}$ and not more than $3×10^{15}$ cm$^{-2}$. A concentration of the first element in the second region 81b is preferably, for example, not less than $1×10^{15}$ cm$^{-2}$ and not more than $3×10^{15}$ cm$^{-2}$. With such a concentration, the glide of the basal plane dislocation 71 is effectively suppressed.

In the embodiment, the first region 81a and the second region 81b can suppress the reaching of the basal plane dislocation 71 to the operating region 80A. For example, a density of basal plane dislocations 71 in the first region 81a is higher than a density of basal plane dislocations 71 in the operating region 80A. For example, a density of basal dislocations 71 in the second region 81b is higher than the density of basal plane dislocations 71 in the operating region 80A.

For example, as shown in FIG. 2, the first region 81a and the second region 81b may include the basal plane dislocation 71, and the operating region 80A may not include the basal plane dislocation 71.

As shown in FIG. 2, a thickness of the silicon carbide member 80 along the third direction is taken as a thickness W1. The third direction is, for example, along the Z-axis direction. The third direction crosses a plane including the first direction and the second direction. In the embodiment, the first length L1 is preferably not less than 10 times and not more than 50 times the thickness W1 of the silicon carbide member 80. For example, the appropriate first length L1 when the thickness W1 is thick may be shorter than the appropriate first length L1 when the thickness W1 is thin.

In the embodiment, multiple structures corresponding to multiple semiconductor devices may be formed on one wafer, and the multiple structures may be divided to manufacture multiple semiconductor devices. In the dividing process, the basal plane dislocation 71 may be generated at least one end of the multiple semiconductor devices as a base point. Such basal plane dislocations 71 may also glide. Stacking faults may grow based on such basal plane dislocations 71. The first element region 81 according to the embodiment can suppress the reaching of such basal plane dislocations 71 to the operating region 80A.

As shown in FIGS. 1 and 3, the silicon carbide member 80 may include a second element region 82. The second element region 82 includes a second element. The second element includes, for example, at least one selected from the group consisting of B, Al and Ga. The second element region 82 is of p-type. For example, the second element region 82 includes a first partial region 82a, a second partial region 82b, a third partial region 82c, and a fourth partial region 82d.

The first partial region 82a is between the first region 81a and the operating region 80A in the first direction ([1-100] direction). The second partial region 82b is between the operating region 80A and the second region 81b in the first direction. The operating region 80A is between the third partial region 82c and the fourth partial region 82d in the second direction ([11-20] direction).

The second element region 82 is, for example, a junction termination region. The second element region 82 makes it easier to obtain, for example, a high breakdown voltage.

A length of the first partial region 82a along the first direction is taken as the length LL1. A length of the second partial region 82b along the first direction is taken as a length LL2. A length of the third partial region 82c along the second direction is taken as a length LL3. A length of the fourth partial region 82d along the second direction is taken as a length LL4. These lengths (widths) are sufficiently shorter than the first length L1 and the like.

For example, the first length L1 is preferably not less than 20 times the length LL1 of the first partial region 82a. The second length L2 is preferably longer than one times the length LL2 of the second partial region 82b. For example, each of the first length L1 and the second length L2 is preferably longer than one times the length LL3 of the third partial region 82c. Each of the first length L1 and the second length L2 is preferably longer than one times the length of LL4 of the fourth partial region 82d.

As shown in FIGS. 1 and 3, the second element region 82 may surround the operating region 80A in a plane (substantially X-Y plane) including the first direction and the second direction. The second element region 82 may be annular, for example.

As shown in FIG. 3, when the silicon carbide member 80 includes the third region 81c, the third partial region 82c is between the third region 81c and the operating region 80A in the second direction. When the silicon carbide member 80 includes the fourth region 81d, the fourth partial region 82d is between the operating region 80A and the fourth region 81d in the second direction. As described above, the first length L1 is longer than the fourth length L4 along the second direction of the fourth region 81d. The second length L2 is longer than the fourth length L4.

As shown in FIGS. 1 and 3, the silicon carbide member 80 may further include a third element region 83. The third element region 83 includes a third element. The third element includes at least one selected from the group consisting of N, P and As. The third element region 83 is, for example, of n-type. The third element region 83 includes a fifth partial region 83e, a sixth partial region 83f, a seventh partial region 83g, and an eighth partial region 83h.

The fifth partial region 83e is between the first region 81a and the first partial region 82a in the first direction. The sixth partial region 83f is between the second partial region 82b and the second region 81b in the first direction. The third partial region 82c is between the seventh partial region 83g and the operating region 80A in the second direction. The fourth partial region 82d is between the operating region 80A and the eighth partial region 83h in the second direction.

A length of the fifth partial region 83e along the first direction is taken as a length LL5. A length of the sixth partial region 83f along the first direction is taken as a length LL6. A length of the seventh partial region 83g along the second direction is taken as a length LL7. A length of the eighth partial region 83h along the second direction is taken as a length LL8.

The first length L1 is preferably longer than one times the length LL5 of the fifth partial region 83e. The second length L2 is preferably not less than 20 times the length LL6 of the sixth partial region 83f. Each of the first length L1 and the second length L2 is preferably not less than 20 times the length LL7 of the seventh partial region 83g. Each of the first length L1 and the second length L2 is preferably not less than 20 times the length LL8 of the eighth partial region 83h.

As shown in FIG. 3, when the silicon carbide member 80 includes the third region 81c, the seventh partial region 83g is between the third region 81c and the third partial region 82c in the second direction. When the silicon carbide member 80 includes the fourth region 81d, the eighth partial region 83h is between the fourth partial region 82d and the fourth region 81d in the second direction. The first length L1 is longer than the fourth length L4 along the second direction of the fourth region 81d. The second length L2 is longer than the fourth length L4.

The second element region 82 and the third element region 83 are included in, for example, a termination region 80T (see FIG. 2). The second element region 82 may be separated from the third element region 83.

As shown in FIG. 2, the first region 81a has a length t1 along the Z-axis direction. The Z-axis direction crosses the plane including the first direction and the second direction. The second region 81b has a length t2 along the Z-axis direction. The length t1 corresponds to the thickness of the first region 81a. The length t2 corresponds to the thickness of the second region 81b. Each of the length t1 and the length t2 may be, for example, not less than 0.2 times and not more than 10 times the thickness of the second element region 82 (the length along the Z-axis direction). Each of the length t1 and the length t2 may be, for example, not less than 0.2 times and not more than 10 times the thickness of the third element region 83 (the length along the Z-axis direction).

As shown in FIGS. 1 and 3, the semiconductor device 110 or the semiconductor device 111 may include an electrode 50E. The electrode 50E is electrically connected with at least one of the diodes or transistors provided in the operating region 80A being above-mentioned. The first element region 81 is preferably in a floating state with respect to the electrode 50E. This suppresses hole injection. Since the first element region 81 is conductive and the first element region 81 is in the floating state with respect to the electrode 50E, it becomes easy to suppress forward voltage deterioration during energization.

Figure 4:
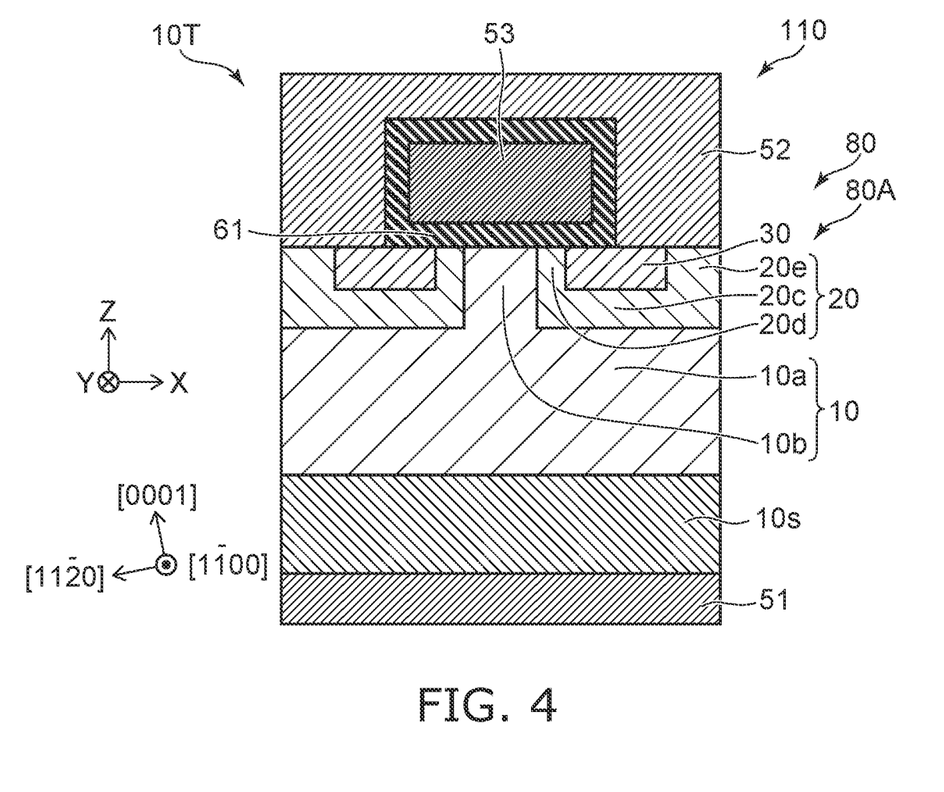
FIG. 4 is a schematic cross-sectional view illustrating a part of the semiconductor device according to the first embodiment.

FIG. 4 is a schematic cross-sectional view illustrating a part of the semiconductor device according to the first embodiment.

FIG. 4 is a sectional view taken along line B1-B2 of FIG. 4. FIG. 4 corresponds to at least a part of the operating area 80A. As shown in FIG. 4, in this example, the operating region 80A includes a transistor 10T.

The transistor 10T includes a first electrode 51, a second electrode 52, a third electrode 53, and an insulating portion 61. The stacking direction from the first electrode 51 to the second electrode 52 crosses the plane including the first direction and the second direction (substantially the X-Y plane). The stacking direction is, for example, the Z-axis direction.

At least a part of the operating region 80A of the silicon carbide member 80 is between the first electrode 51 and the third electrode 53 in the stacking direction (Z-axis direction). The operating region 80A includes the first conductive type first semiconductor region 10, the second conductive type second semiconductor region 20, and a first conductive type third semiconductor region 30. The first conductive type is one of the n-type and the p-type. The second conductive type is the other of the n-type and the p-type. In the following, the first conductive type is n-type and the second conductive type is p-type.

The first semiconductor region 10 and the third semiconductor region 30 include SiC and a fourth element. The fourth element includes at least one selected from the group consisting of N, P and As. The second semiconductor region 20 includes SiC and a fifth element. The fifth element includes at least one selected from the group consisting of B, Al and Ga.

The first semiconductor region 10 includes a first semiconductor portion 10a and a second semiconductor portion 10b. A direction from the second semiconductor portion 10b toward the third electrode 53 is along the stacking direction (Z-axis direction). The crossing direction from the second semiconductor portion 10b toward the first semiconductor portion 10a crosses the stacking direction (Z-axis direction). In this example, the crossing direction corresponds to the X-axis direction.

A direction from the first semiconductor portion 10a toward the third semiconductor region 30 is along the stacking direction (Z-axis direction). The second semiconductor region 20 includes a third semiconductor portion 20c and a fourth semiconductor portion 20d. The third semiconductor portion 20c is between the first semiconductor portion 10a and the third semiconductor region 30 in the stacking direction (Z-axis direction). The fourth semiconductor portion 20d is between a part of the second semiconductor portion 10b and the third semiconductor region 30 in the crossing direction (X-axis direction).

The first electrode 51 is electrically connected with the first semiconductor region 10 through the base body 10s. The second electrode 52 is electrically connected with the third semiconductor region 30. At least a part of the insulating portion 61 is between the second semiconductor portion 10b and the third electrode 53, and between the fourth semiconductor portion 20d and the third electrode 53.

In the semiconductor device 110, a current flowing between the first electrode 51 and the second electrode 52 can be controlled by a potential of the third electrode 53. The potential of the third electrode 53 may be a potential based on a potential of the second electrode 52. The first electrode 51 functions, for example, as a drain electrode. The second electrode 52 functions, for example, as a source electrode. The third electrode 53 functions as a gate electrode. The base body 10s is, for example, of the first conductive type. The semiconductor device 110 is, for example, a MOSFET.

In this example, the second semiconductor region 20 includes a fifth semiconductor portion 20e. In the X-axis direction, the third semiconductor region 30 is between the fourth semiconductor portion 20d and the fifth semiconductor portion 20e. The second electrode 52 is electrically connected with the fifth semiconductor portion 20e. The operating region 80A in the semiconductor device 111 may also have a configuration similar to the configuration illustrated in FIG. 4.

Figure 5:
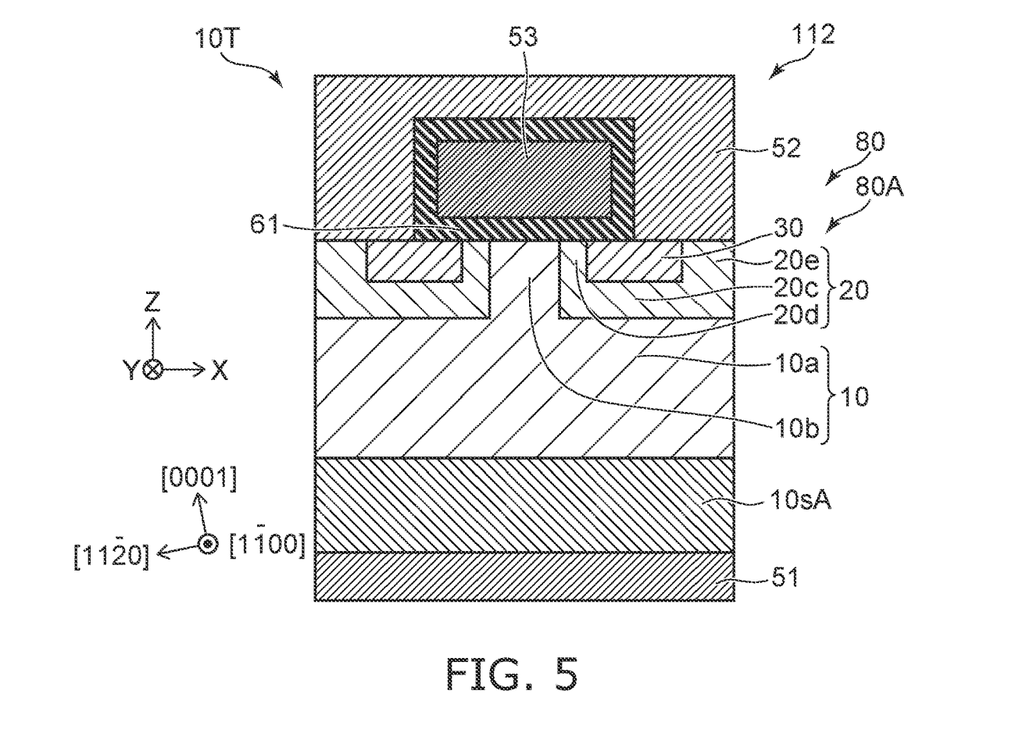
FIG. 5 is a schematic cross-sectional view illustrating a part of a semiconductor device according to the first embodiment.

FIG. 5 is a schematic cross-sectional view illustrating a part of a semiconductor device according to the first embodiment.

FIG. 5 is a cross-sectional view corresponding to lines B1-B2 of FIG. 1. FIG. 5 corresponds to at least a part of the operating area 80A. As shown in FIG. 5, in the semiconductor device 112 according to the embodiment, the operating region 80A includes the transistor 10T.

As shown in FIG. 5, in the semiconductor device 112, the operating region 80A of the silicon carbide member 80 includes a second conductive type (p-type) base body 10sA. The base body 10sA is between the first electrode 51 and the first semiconductor region 10. The semiconductor device 112 is, for example, an IGBT (Insulated Gate Bipolar Transistor). The configuration (first element region 81, etc.) other than the above in the semiconductor device 112 may be the same as the configuration in the semiconductor devices 110 and 111.

Second Embodiment

Figure 6:
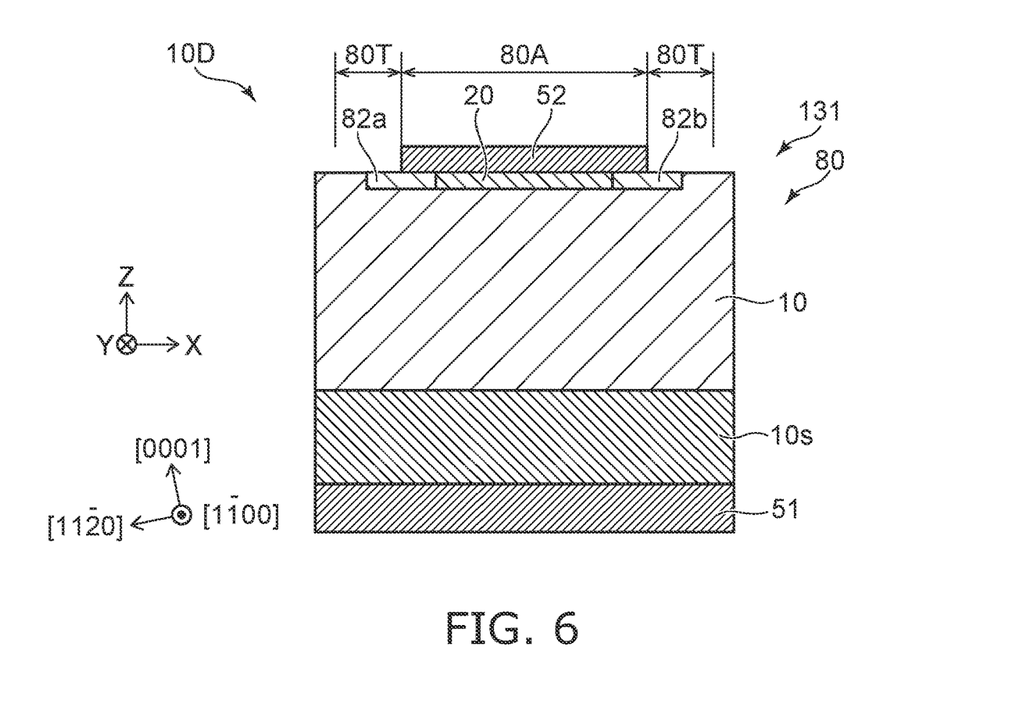
FIG. 6 is a schematic cross-sectional view illustrating a semiconductor device according to a second embodiment.

FIG. 6 is a schematic cross-sectional view illustrating a semiconductor device according to a second embodiment.

FIG. 6 illustrates the operating area 80A and the termination region 80T. As shown in FIG. 6, in a semiconductor device 113 according to the embodiment, the operating region 80A includes a diode 10D.

As shown in FIG. 6, the diode 10D includes the first electrode 51 and the second electrode 52. The stacking direction (Z-axis direction) from the first electrode 51 toward the second electrode 52 crosses the plane including the first direction and the second direction (substantially the X-Y plane). At least a part of the operating region 80A of the silicon carbide member 80 is between the first electrode 51 and the second electrode 52 in the stacking direction (Z-axis direction).

The operating region 80A includes the first conductive type first semiconductor region 10 and the second conductive type second semiconductor region 20. The first semiconductor region 10 is between the first electrode 51 and the second electrode 52. The second semiconductor region 20 is between the first semiconductor region 10 and the second electrode 52. The first electrode 51 is electrically connected with the first semiconductor region 10. The second electrode 52 is electrically connected with the second semiconductor region 20. The first electrode 51 is, for example, a cathode electrode. The second electrode 52 is, for example, an anode electrode.

In the semiconductor device 113, the portion excluding the operating region 80A and the termination region 80T may be the same as that of the semiconductor device 110. In the semiconductor device 113, the silicon carbide member 80 includes a first element region 81 (for example, the first region 81a and the second region 81b). Also in the semiconductor device 113, the glide of the basal plane dislocation 71 is suppressed. A semiconductor device which can stabilize characteristics can be provided.

In the embodiment, at least one of the first electrode 51 or the second electrode 52 includes, for example, at least one selected from the group consisting of Al, Cu and Au. For example, the third electrode 53 (e.g., the gate electrode) includes at least one selected from the group consisting of TiN, Al, Ru, W, and TaSiN. The insulating portion 61 includes, for example, at least one selected from the group consisting of silicon oxide, silicon nitride, silicon oxynitride, aluminum oxide and hafnium oxide.

In the embodiment, information on the impurity concentration can be obtained by, for example, SIMS (Secondary Ion Mass Spectrometry). In the above, the impurity concentration may be, for example, a carrier concentration. Information on the relatively high and low of the impurity concentration can be obtained, for example, based on the information on the relatively high and low of the carrier concentration obtained by SCM (Scanning Capacitance Microscopy).

The concentration of the first element in the first region 81a is preferably not less than $1.67 \times 10^{19}$ cm$^{-3}$ and not more than $5 \times 10^{19}$ cm$^{-3}$, for example. The concentration of the first element in the second region 81b is preferably not less than $1.67 \times 10^{19}$ cm$^{-3}$ and not more than $5 \times 10^{19}$ cm$^{-3}$, for example. With such a concentration, the glide of the basal plane dislocation 71 is effectively suppressed.

In one example, the dose amount of the first element in the first region 81a is, for example, not less than $1 \times 10^{15}$ cm$^{-2}$ and not more than $3 \times 10^{15}$ cm$^{-2}$. In one example, the dose amount of the first element in the second region 81b is, for example, not more than $1 \times 10^{15}$ cm$^{-2}$ and not less than $3 \times 10^{15}$ cm$^{-2}$. With such a dose amount, the glide of the basal plane dislocation 71 is effectively suppressed. The introduction of the first element into these regions may be carried out by, for example, ion implantation or the like. The thickness of the first region 81a and the second region 81b (length t1 and length t2: see FIG. 2) is, for example, not less than 0.4 μm and not more than 0.8 μm (for example, about 0.6 μm).

For example, it is preferable that the concentration (unit: cm$^{-3}$) of the first element in the first region 81a and the second region 81b is not less than one times and not more than 20 times the concentration (unit: cm$^{-3}$) of the second element (B, Al, Ga, etc.) in the second element region 82 (first partial region 82a, second partial region 82b, third partial region 82c and fourth partial region 82d, etc.).

For example, it is preferable that the concentration (unit: cm$^{-3}$) of the first element in the first region 81a and the second region 81b is not less than 10 times and not more than 200 times the concentration (unit: cm$^{-3}$) of the third element (N, P, As, etc.) in the third element region 83 (fifth partial region 83e, sixth partial region 83f, seventh partial region 83g and eighth partial region 83h, etc.).

As shown in FIG. 2, the first semiconductor region 10 includes a portion that overlaps the first region 81a in the Z-axis direction. The thickness of the first region 81a and the second region 81b (each of the length t1 and the length t2) is, for example, preferably not less than 1/100 times and not more than 1/15 times the thickness (length along the Z-axis direction) of the part of the first semiconductor region 10 that overlaps the first region 81a in the Z-axis direction.

According to embodiments, a semiconductor device which can stabilize characteristics can be provided.

In the specification, "a state of electrically connected" includes a state in which multiple conductors physically contact and a current flows between the multiple conductors. "a state of electrically connected" includes a state in which another conductor is inserted between the multiple conductors and a current flows between the multiple conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as silicon carbide members, semiconductor regions, base bodies, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a silicon carbide member,
    the silicon carbide member including
        an operating region including at least one of a diode or a transistor, and
        a first element region including at least one element selected from the group consisting of Ar, V, Al and B,
    the first element region including a first region and a second region, a first direction from the first region toward the second region being along a [1-100] direction of the silicon carbide member, the operating region being between the first region and the second region in the first direction, and a second direction being along a [11-20] of the silicon carbide member,
    the first element region not including a region overlapping the operating region in the second direction, or the first element region including a third region overlapping the operating region in the second direction, a first length of the first region along the first direction being longer than a third length of the third region along the second direction, a second length of the second region along the first direction being longer than the third length.

2. The device according to claim 1, wherein
    the first length is not less than 10 times and not more than 50 times the third length, and
    the second length is not less than 10 times and not more than 50 times the third length.

3. The device according to claim 1, wherein
    a concentration of the first element in the first region is not less than $1.67 \times 10^{19}$ cm$^{-3}$ and not more than $5 \times 10^{19}$ cm$^{-3}$, and
    a concentration of the first element in the second region is not less than $1.67 \times 10^{19}$ cm$^{-3}$ and not more than $5 \times 10^{19}$ cm$^{-3}$.

4. The device according to claim 1, wherein
    a density of a basal plane dislocation in the first region is higher than a density of a basal plane dislocation in the operating region, and
    a density of a basal plane dislocation in the second region is higher than a density of the basal plane dislocation in the operating region.

5. The device according to claim 1, wherein
    the first region and the second region include a basal plane dislocation, and
    the operating region does not include a basal plane dislocation.

6. The device according to claim 1, wherein
    the first length is not less than 10 times and not more than 50 times a thickness of the silicon carbide member, and the thickness is along a third direction crossing a plane including the first direction and the second direction.

7. The device according to claim 1, wherein
    the silicon carbide member further includes a second element region,
    the second element region includes a second element including at least one selected from the group consisting of B, Al, and Ga,
    the second element region includes a first partial region, a second partial region, a third partial region, and a fourth partial region,
    the first partial region is between the first region and the operating region in the first direction,
    the second partial region is between the operating region and the second region, and
    the operating region is between the third partial region and the fourth partial region in the second direction.

8. The device according to claim 7, wherein
    the first length is not less than 20 times a length of the first partial region along the first direction, and
    the second length is not less than 20 times a length of the second partial region along the first direction.

9. The device according to claim 7, wherein
    the second element region surrounds the operating region in a plane including the first direction and the second direction.

10. The device according to claim 7, wherein
    the silicon carbide member includes the third region, and
    the third partial region is between the third region and the operating region.

11. The device according to claim 10, wherein
    the silicon carbide member includes a fourth region,
    the fourth partial region is between the operating region and the fourth region,
    the first length is longer than a fourth length of the fourth region along the second direction, and
    the second length is longer than the fourth length.

12. The device according to claim 7, wherein
    the silicon carbide member further includes a third element region,
    the third element region includes a third element including at least one selected from the group consisting of N, P and As,
    the third element region includes a fifth partial region, a sixth partial region, a seventh partial region, and an eighth partial region,
    the fifth partial region is between the first region and the first partial region,
    the sixth partial region is between the second partial region and the second region,
    the third partial region is between the seventh partial region and the operating region, and
    the fourth partial region is between the operating region and the eighth partial region.

13. The device according to claim 12, wherein
    the first length is not less than 20 times a length of the fifth partial region along the first direction, and
    the second length is not less than 20 times a length of the sixth partial region along the first direction.

14. The device according to claim 12, wherein
    the silicon carbide member includes the third region, and
    the seventh partial region is between the third region and the third partial region.

15. The device according to claim 14, wherein
    the silicon carbide member includes a fourth region,
    the eighth partial region is between the fourth partial region and the fourth region,
    the first length is longer than a fourth length of the fourth region along the second direction, and
    the second length is longer than the fourth length.

16. The device according to claim 1, further comprising:
an electrode,
the electrode being electrically connected with the at least one of the diode or the transistor,
the first element region being in a floating state with respect to the electrode.

17. The device according to claim 1, wherein
the transistor includes a first electrode, a second electrode, a third electrode, and an insulating portion,
a stacking direction from the first electrode toward the second electrode crosses a plane including the first direction and the second direction,
at least a part of the operating region is between the first electrode and the third electrode in the stacking direction,
the operating region includes
 a first semiconductor region of a first conductivity type,
 a second semiconductor region of a second conductivity type, and
 a third semiconductor region of the first conductivity type,
the first semiconductor region includes a first semiconductor portion and a second semiconductor portion,
a direction from the second semiconductor portion toward the third electrode is along the stacking direction,
a crossing direction from the second semiconductor portion toward the first semiconductor portion crosses the stacking direction,
a direction from the first semiconductor portion toward the third semiconductor region is along the stacking direction,
the second semiconductor region includes a third semiconductor portion and a fourth semiconductor portion,
the third semiconductor portion is between the first semiconductor portion and the third semiconductor region in the stacking direction,
the fourth semiconductor portion is between a part of the second semiconductor portion and the third semiconductor region in the crossing direction,
the first electrode is electrically connected with the first semiconductor region,
the second electrode is electrically connected with the third semiconductor region, and
at least a part of the insulating portion is between the second semiconductor portion and the third electrode and between the fourth semiconductor portion and the third electrode.

18. The device according to claim 17, wherein
the operating region includes a base body of the second conductivity type, and
the base body is between the first electrode and the first semiconductor region.

19. The device according to claim 1, wherein
the diode includes a first electrode and a second electrode,
a stacking direction from the first electrode toward the second electrode crosses a plane including the first direction and the second direction,
at least a part of the operating region is between the first electrode and the second electrode in the stacking direction,
the operating region includes
 a first semiconductor region of a first conductivity type, and
 a second semiconductor region of a second conductivity type,
the first semiconductor region is between the first electrode and the second electrode,
the second semiconductor region is between the first semiconductor region and the second electrode,
the first electrode is electrically connected with the first semiconductor region, and
the second electrode is electrically connected with the second semiconductor region.

20. The device according to claim 1, wherein
each of the first length and the second length is not less than 10 μm.

* * * * *